(12) United States Patent
Nishinohara et al.

(10) Patent No.: US 11,605,690 B2
(45) Date of Patent: Mar. 14, 2023

(54) DISPLAY DEVICE HAVING AN ELECTRIC FIELD INFIBITION FILM

(71) Applicant: Japan Display Inc., Tokyo (JP)

(72) Inventors: Takuma Nishinohara, Tokyo (JP); Hajime Akimoto, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 73 days.

(21) Appl. No.: 16/897,298

(22) Filed: Jun. 10, 2020

(65) Prior Publication Data

US 2020/0303483 A1 Sep. 24, 2020

Related U.S. Application Data

(63) Continuation of application No. PCT/JP2018/038832, filed on Oct. 18, 2018.

(30) Foreign Application Priority Data

Dec. 11, 2017 (JP) .............................. JP2017-237061

(51) Int. Cl.
*H01L 27/12* (2006.01)
*H01L 27/32* (2006.01)
(Continued)

(52) U.S. Cl.
CPC ...... *H01L 27/3272* (2013.01); *H01L 27/3262* (2013.01); *H01L 51/0097* (2013.01);
(Continued)

(58) Field of Classification Search
CPC ............. H01L 27/3272; H01L 27/3262; H01L 27/3274; H01L 27/1214; H01L 29/78633;
(Continued)

(56) References Cited

U.S. PATENT DOCUMENTS 6,449,022 B1 * 9/2002 Fukata .............. H01L 29/42384
349/44
6,822,263 B2 * 11/2004 Satou ................ H01L 21/02422
257/59
(Continued)

FOREIGN PATENT DOCUMENTS

JP 2009-158936 A 7/2009
JP 2016-177187 A 10/2016
(Continued)

OTHER PUBLICATIONS

International Search Report and Written Opinion dated Jan. 22, 2019 for PCT/JP2018/038832 filed on Oct. 18, 2018, 10 pages including English Translation of the International Search Report.
(Continued)

*Primary Examiner* — Ida M Soward
(74) *Attorney, Agent, or Firm* — Xsensus LLP

(57) ABSTRACT

A display device includes: a substrate configured to contain an organic material; a first underlying film provided above the substrate; a thin film transistor provided above the first underlying film; a semiconductor film included in the thin film transistor and configured to have a channel region; and an electric field inhibition film provided between the first underlying film and the semiconductor film and configured to overlap the channel region in a plan view. The electric field inhibition film has a higher permittivity than the first underlying film.

5 Claims, 5 Drawing Sheets

(51) Int. Cl.
*H01L 29/66* (2006.01)
*H01L 29/78* (2006.01)
*H01L 51/00* (2006.01)
*G02F 1/13* (2006.01)
*H01L 29/786* (2006.01)
*H01L 51/52* (2006.01)
*G02F 1/1362* (2006.01)
*G02F 1/1335* (2006.01)
*G02F 1/1333* (2006.01)

(52) U.S. Cl.
CPC .. *G02F 1/133334* (2021.01); *G02F 1/133512* (2013.01); *G02F 1/136209* (2013.01); *G09G 2300/0408* (2013.01); *G09G 2300/0804* (2013.01); *H01L 27/1214* (2013.01); *H01L 27/3211* (2013.01); *H01L 27/3246* (2013.01); *H01L 27/3274* (2013.01); *H01L 29/6678* (2013.01); *H01L 29/66772* (2013.01); *H01L 29/78603* (2013.01); *H01L 29/78633* (2013.01); *H01L 29/78657* (2013.01); *H01L 51/5296* (2013.01); *H01L 2251/5338* (2013.01)

(58) Field of Classification Search
CPC ......... H01L 29/78603; H01L 29/66772; H01L 29/6678; H01L 29/78657; H01L 51/0097; H01L 2251/5338; H01L 27/3246; H01L 27/3295; H01L 27/3211; G02F 1/136209; G02F 1/133512; G02F 1/133334; G09G 2300/0408; G09G 2300/0804
See application file for complete search history.

(56) References Cited

U.S. PATENT DOCUMENTS

| | | | | |
|---|---|---|---|---|
| 7,064,364 B2* | 6/2006 | Okumura | ......... | H01L 29/78675 |
| | | | | 257/288 |
| 8,389,345 B2* | 3/2013 | Tanabe | ............. | H01L 29/78633 |
| | | | | 438/151 |
| 10,121,830 B1* | 11/2018 | Li | ........................ | H01L 27/124 |
| 10,276,601 B2* | 4/2019 | Kanda | ............... | H01L 29/78696 |
| 10,418,435 B2* | 9/2019 | Wang | .................. | H01L 27/3262 |
| 10,488,569 B2* | 11/2019 | Watabe | ............ | H01L 29/78603 |
| 10,847,545 B2* | 11/2020 | Lee | ....................... | H01L 27/124 |
| 2001/0040645 A1* | 11/2001 | Yamazaki | ......... | G02F 1/134309 |
| | | | | 349/42 |
| 2004/0053452 A1* | 3/2004 | Hasegawa | ......... | H01L 29/66757 |
| | | | | 438/151 |
| 2004/0135940 A1* | 7/2004 | Tsunekawa | ....... | G02F 1/136209 |
| | | | | 349/110 |
| 2007/0035225 A1* | 2/2007 | Lee | .................... | H01L 51/5281 |
| | | | | 313/111 |
| 2008/0111477 A1* | 5/2008 | Kim | ................... | H01L 27/3272 |
| | | | | 313/503 |
| 2008/0303408 A1* | 12/2008 | Yamazaki | ........... | H01L 27/3244 |
| | | | | 313/498 |
| 2009/0140053 A1 | 6/2009 | Yamazaki et al. | | |
| 2011/0220896 A1* | 9/2011 | Miyakawa | ........ | H01L 29/66765 |
| | | | | 257/E29.294 |
| 2012/0037993 A1 | 2/2012 | Yamazaki et al. | | |
| 2014/0124761 A1* | 5/2014 | Jeon | ..................... | H01L 27/3272 |
| | | | | 257/40 |
| 2014/0183476 A1* | 7/2014 | Kwon | .................. | H01L 31/036 |
| | | | | 257/43 |
| 2016/0005803 A1* | 1/2016 | Ryu | .................... | H01L 27/3248 |
| | | | | 257/40 |
| 2016/0020264 A1* | 1/2016 | Choo | .................. | H01L 27/1225 |
| | | | | 257/40 |
| 2016/0049454 A1* | 2/2016 | Park | .................... | H01L 27/3276 |
| | | | | 257/40 |
| 2016/0049615 A1* | 2/2016 | Kim | .................... | H01L 27/3276 |
| | | | | 257/40 |
| 2016/0141348 A1* | 5/2016 | Lin | ..................... | H01L 27/3272 |
| | | | | 257/40 |
| 2016/0163745 A1* | 6/2016 | Choi | ................... | H01L 27/1225 |
| | | | | 257/40 |
| 2016/0211383 A1* | 7/2016 | Harding | ............ | H01L 29/78648 |
| 2016/0218305 A1 | 7/2016 | Kim et al. | | |
| 2016/0254338 A1* | 9/2016 | Lin | ................... | H01L 29/78675 |
| | | | | 257/40 |
| 2016/0276626 A1 | 9/2016 | Andou | | |
| 2017/0025439 A1* | 1/2017 | I | ........................... | H01L 27/1222 |
| 2017/0025488 A1* | 1/2017 | Li | ......................... | H01L 27/326 |
| 2017/0062541 A1* | 3/2017 | Ishiyama | ........... | H01L 51/0097 |
| 2017/0062546 A1* | 3/2017 | Kim | ................... | H01L 27/1244 |
| 2017/0117343 A1* | 4/2017 | Oh | ....................... | G09G 3/3233 |
| 2017/0194404 A1* | 7/2017 | Park | ................... | H01L 27/3276 |
| 2017/0278909 A1* | 9/2017 | Jeon | .................... | G06F 3/0421 |
| 2017/0294497 A1* | 10/2017 | Lius | .................... | H01L 27/3272 |
| 2017/0338429 A1 | 11/2017 | Watabe | | |
| 2018/0019294 A1* | 1/2018 | Zhai | ................... | H01L 27/3279 |
| 2018/0026080 A1* | 1/2018 | Lee | .................... | H01L 27/3211 |
| | | | | 257/40 |
| 2018/0047830 A1* | 2/2018 | Lu | ...................... | H01L 21/02592 |
| 2018/0053905 A1* | 2/2018 | Lee | .................... | H01L 27/3276 |
| 2018/0061906 A1* | 3/2018 | Kim | .................... | H01L 27/326 |
| 2018/0123080 A1* | 5/2018 | Kim | .................... | H01L 27/3255 |
| 2018/0151120 A1* | 5/2018 | Kim | ................... | G09G 3/3258 |
| 2018/0151654 A1* | 5/2018 | Lee | .................... | H01L 29/41733 |
| 2018/0151831 A1* | 5/2018 | Lee | ................... | H01L 27/3223 |
| 2018/0226498 A1 | 8/2018 | Sasaki et al. | | |
| 2018/0286936 A1* | 10/2018 | Lee | .................. | H01L 29/78603 |
| 2019/0013378 A1* | 1/2019 | Wang | ................ | H01L 27/3272 |
| 2019/0067338 A1* | 2/2019 | Ma | ..................... | H01L 51/5284 |

FOREIGN PATENT DOCUMENTS

| | | |
|---|---|---|
| JP | 2017-212038 A | 11/2017 |
| JP | 2018-129430 A | 8/2018 |

OTHER PUBLICATIONS

Japanese Office Action dated Feb. 1, 2022, for corresponding Japanese Patent Application No. 2017-237061.

* cited by examiner

DISPLAY DEVICE HAVING AN ELECTRIC FIELD INFIBITION FILM

CROSS-REFERENCE TO RELATED APPLICATION

The present application is continuation of International Application No. PCT/JP2018/038832 filed on Oct. 18, 2018, which claims priority from Japanese Application No. JP 2017-237061 filed on Dec. 11, 2017. The contents of these applications are hereby incorporated by reference into this application.

BACKGROUND

1. Field of the Invention

The present invention relates to a display device.

2. Description of the Related Art

Foldable sheet displays are provided to markets, such as organic EL display devices adopted in smartphones. In foldable sheet displays, organic materials are used for substrates and transistors are formed on the substrates. JP 2016-177187A discloses an organic EL display device in which a flexible substrate is used.

SUMMARY OF THE INVENTION

Substrates in which organic materials are used tend to store charges more easily than substrates formed of inorganic materials. When charges are stored in substrates formed of organic materials, characteristics of transistors vary due to electric fields generated by the charges and have an influence on displayed images in some cases.

The present invention is carried out in view of the foregoing circumstances and an object of the present invention is to provide a display device capable of inhibiting a variation in characteristics of transistors disposed on a substrate formed of an organic material.

According to an aspect of the present invention, a display device includes: a substrate configured to contain an organic material; a first underlying film provided above the substrate; a thin film transistor provided above the first underlying film; a semiconductor film included in the thin film transistor and configured to have a channel region; and an electric field inhibition film provided between the first underlying film and the semiconductor film and configured to overlap the channel region in a plan view. The electric field inhibition film has a higher permittivity than the first underlying film.

According to the present invention, it is possible to inhibit a variation in characteristics of transistors disposed on a substrate formed of an organic material.

DETAILED DESCRIPTION OF THE INVENTION

Figure 1:
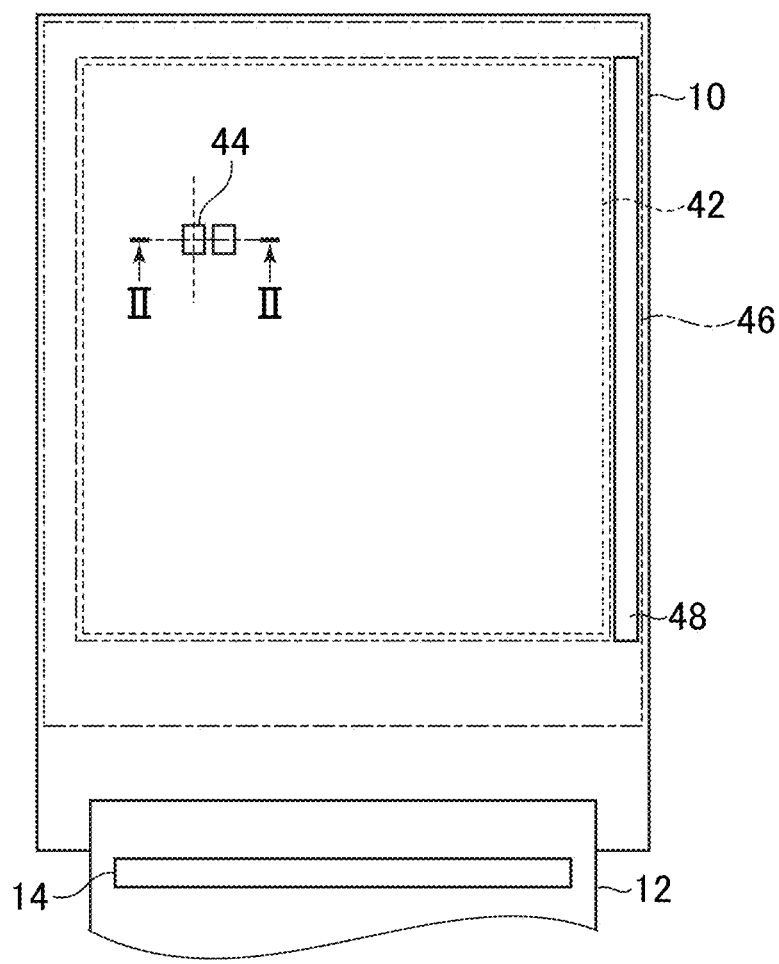
FIG. 1 is a plan view illustrating an organic EL display device according to an embodiment of the present invention.

Hereinafter, embodiments of the present invention will be described with reference to the drawings. However, the present invention can be carried out in various modes without departing from the gist of the present invention, and is not to be construed as being limited to the description of the embodiments exemplified below.

The drawings may be schematically illustrated in terms of width, thickness, shape, and the like of each portion as compared with actual embodiments in order to make the description clearer, but are merely examples, and are not intended to limit the interpretation of the present invention. In the specification and the drawings, elements having the same functions as those described in relation to the above-described drawings are denoted by the same reference numerals, and the redundant description may be omitted.

Furthermore, in the detailed description of the present invention, when defining the positional relationship between a certain component and another component, the terms "above" and "below" include not only the case where located directly above or below the certain component, but also the case where other components are further interposed therebetween unless otherwise specified.

FIG. 1 is a plan view illustrating an organic electroluminescence (EL) display device according to an embodiment of the present invention. The organic EL display device includes a substrate 10, a flexible printed substrate 12, and an integrated circuit package 14 disposed on the flexible printed substrate 12. The organic EL display device according to the embodiment is a bendable sheet display or a flexible display.

The substrate 10 includes a display region 42 and a peripheral region 46 surrounding the display region 42. The peripheral region 46 is outside of the display region 42. A plurality of unit pixels 44 are disposed in the display region 42. In the organic EL display device, for example, full-color pixels are formed by combining unit pixels (sub-pixels) with a plurality of colors of red, green, and blue, so that a full-color image is displayed. The flexible printed substrate 12 is connected in an end of the substrate 10 in one direction. Some of driving circuits are mounted on the integrated circuit package 14. The driving circuits drive pixel circuits included in the unit pixels 44. Some of the driving circuits 48 are also disposed in the peripheral region 46 on the substrate 10.

Figure 2:
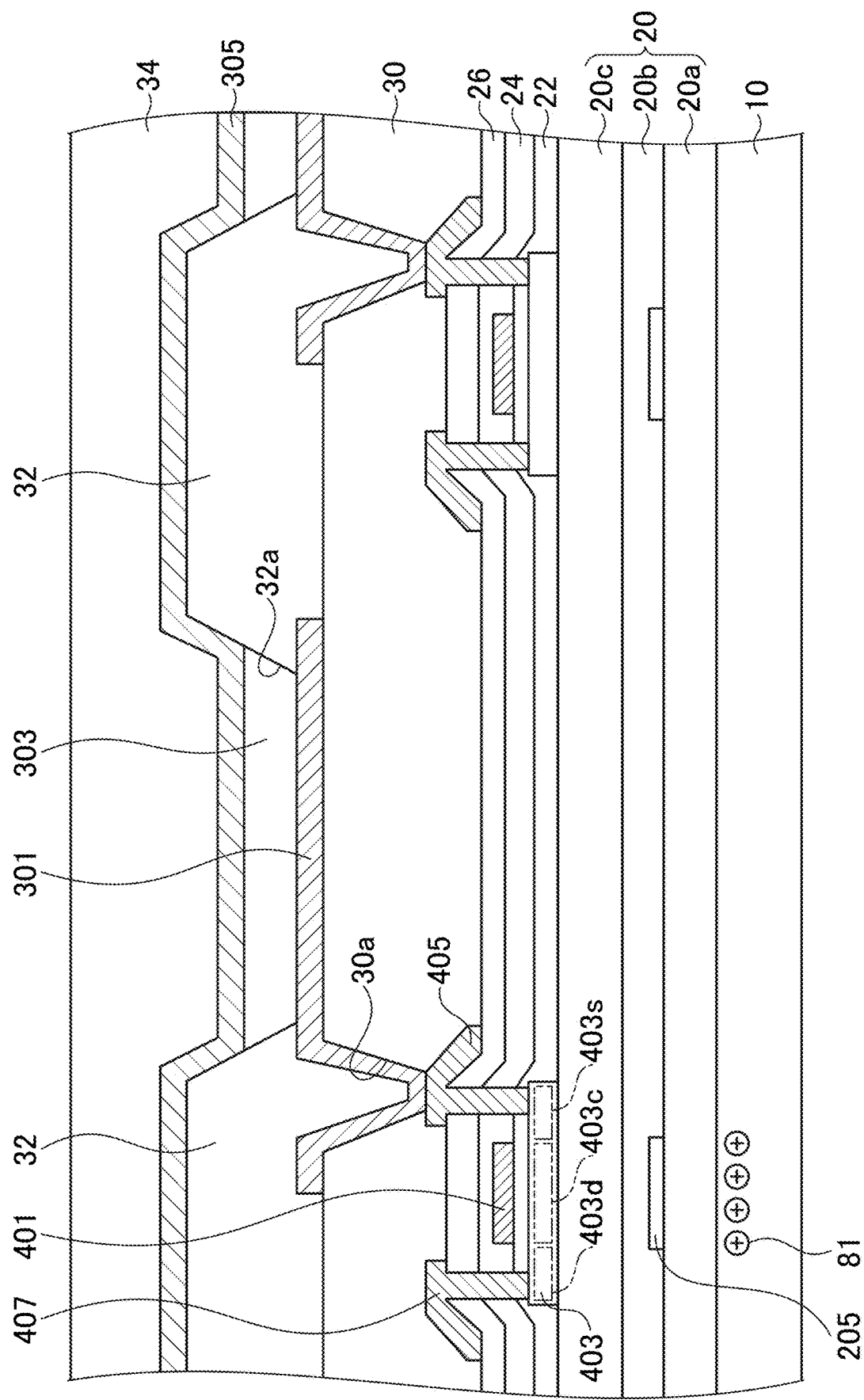
FIG. 2 is a cross-sectional view taken along the line II-II of the organic EL display device illustrated in FIG. 1.

FIG. 2 is a cross-sectional view taken along the line II-II of the organic EL display device illustrated in FIG. 1. A material of the substrate 10 (an array substrate) is polyimide, but any resin material may be used as long as the material has sufficient flexibility to configure a sheet display or a flexible display.

A first underlying layer 20a that contains silicon oxide is provided above the substrate 10. A second underlying layer 20b that contains silicon nitride is provided above the first underlying layer 20a. A plurality of electric field inhibition films 20S separated from each other in a plan view are provided between the first underlying layer 20a and the second underlying layer 20b. The first underlying layer 20a and the second underlying layer 20b are provided in a substantially entire region of the substrate 10 in a plan view to overlap at least the entire display region 42. The electric field inhibition films 20S are not provided in the substantially entire region of the substrate 10 and do not overlap the entire region of the display region 42. As illustrated in FIG. 2, the plurality of electric field inhibition films 205 are provided to be separated from each other. Side surfaces of the electric field inhibition film 205 are covered with the second underlying layer 20b. A part of the first underlying layer 20a and a part of the second underlying layer 20b come into direct contact with each other. The electric field inhibition film 205 is provided to overlap a position of the thin film transistor. The details of the disposition of the electric field inhibition film 205 will be described later. A third underlying layer 20c that contains silicon oxide is provided above the second underlying layer 20b.

The first underlying layer 20a improves adhesion with the substrate 10, the second underlying layer 20b blocks moisture and impurities from the outside, the third underlying layer 20c blocks hydrogen atoms contained in the second underlying layer 20b so that the hydrogen atoms do not spread to a semiconductor film 403 of a thin film transistor located in an upper portion. These three layers are collectively referred to as an underlying layer 20. The underlying layer 20 is not limited to a 3-layer stacked structure, but a layer may be further stacked or a single layer or two layers may be formed. The thickness of the underlying layer 20 is equal to or greater than 500 nm and less than 1000 nm.

A plurality of thin film transistors are formed above the underlying layer 20. Each of the thin film transistors includes a gate electrode 401, the semiconductor film 403, a source electrode 405, and a drain electrode 407. The semiconductor film 403 is provided above the underlying layer 20. The semiconductor film 403 is formed of polysilicon, but may be formed of a transparent amorphous oxide semiconductor (TAOS). A first insulating layer 22 that contains silicon oxide is provided above the semiconductor film 403. A first conductive layer that includes the gate electrode 401 overlapping the semiconductor film 403 in a plan view is provided above the first insulating layer 22. A second insulating layer 24 that contains silicon nitride and a third insulating layer 26 that contains silicon oxide are provided in sequence above the gate electrode 401. One of the second insulating layer and the third insulating layer 26 may be omitted. The first insulating layer 22 to the third insulating layer 26 may be formed of another material with an insulation property. A second conductive layer that includes the source electrode 405 and the drain electrode 407 is provided above the third insulating layer 26. The first insulating layer 22 is provided as a so-called gate insulating film. The first conductive layer is formed of, for example, MoW. The second conductive layer has, for example, a 3-layer stacked structure of Ti, Al, and Ti.

The semiconductor film 403 includes a channel region 403c that overlaps the gate electrode 401, and a source region 403s and a drain region 403d that interpose the channel region 403c. In the semiconductor film 403, a low-concentration impurity region may be provided between the channel region 403c and each of the source region 403s and the drain region 403d. In the first insulating layer 22, the second insulating layer 24, and the third insulating layer 26, two contact holes are formed. The two contact holes reach upper surfaces of the source region 403s and the drain region 403d of semiconductor film 403 respectively, and the source electrode 405 and the drain electrode 407 are provided inside each of the contact holes. The source electrode 405 is electrically connected to the source region 403s and the drain electrode 407 is electrically connected to the drain region 403d. The drain electrode 407 is connected to a wiring included in a pixel circuit and the source electrode 405 is connected to a pixel electrode 301.

Here, the electric field inhibition film 205 is formed of alumina (aluminum oxide) which has a higher relative permittivity than the silicon nitride or the silicon oxide contained in the underlying layer 20 and which has a stronger insulation property than the silicon nitride or the silicon oxide. The electric field inhibition film 205 is formed by stacking aluminum oxide in accordance with an atomic layer deposition (ALD) method. Since a dense alumina film can be formed in accordance with the ALD method, the permittivity or the insulation property of the electric field inhibition film 205 can be further raised. The electric field inhibition film 205 may be formed in accordance with a sputtering method or the like. The thickness of the electric field inhibition film 205 is equal to or greater than 10 nm and equal to or less than 100 nm. The electric field inhibition film 205 covers the channel region 403c of the semiconductor film 403 in a plan view. The electric field inhibition film 205 may have a structure which covers a region in which the semiconductor film 403 overlaps the gate electrode 401. The electric field inhibition film 205 is disposed more inside than an edge of the semiconductor film 403 on the side of the source region 403s and an edge of the semiconductor film 403 on the side of the drain region 403d when viewed in the extension direction of the channel region 403c. In other words, a length in a direction of a channel length of the thin film transistor of the electric field inhibition film 205 is equal to or greater than the length of the channel length and is less than a length of the semiconductor film 403 in the direction of the channel length.

When an electric field is applied, a material with a high permittivity is polarized, and the electric field is weakened. In the embodiment, the substrate 10 formed of an organic material such as a polyimide has characteristics in which charges 81 are stored during manufacturing or in use after manufacturing. The phenomenon in which the charges 81 are stored is referred to as charge-up. In the electric field inhibition film 205, the electric field applied to the semiconductor film 403 can be weakened due to the charges 81. Thus, it is possible to inhibit a variation in characteristics of the thin film transistor caused due to the charges 81. Instead of using the electric field inhibition film 205, it is possible to inhibit the variation in the characteristics of the thin film transistor by causing the underlying layer 20 to be thicker. However, the entire thickness of the display device or the thickness of the panel increases. While inhibiting an increase in the thickness of the underlying layer 20 by using the electric field inhibition film 205, in other words, inhibiting the increase in the entire thickness of the display device, it is possible to inhibit the variation in the characteristics of the thin film transistor due to the charges 81. Since the electric field inhibition film 205 has the high insulation property, it is possible to inhibit movement of charges from the thin film transistor to the substrate 10. Accordingly, it is also possible to inhibit an influence of the charges.

Figure 3:
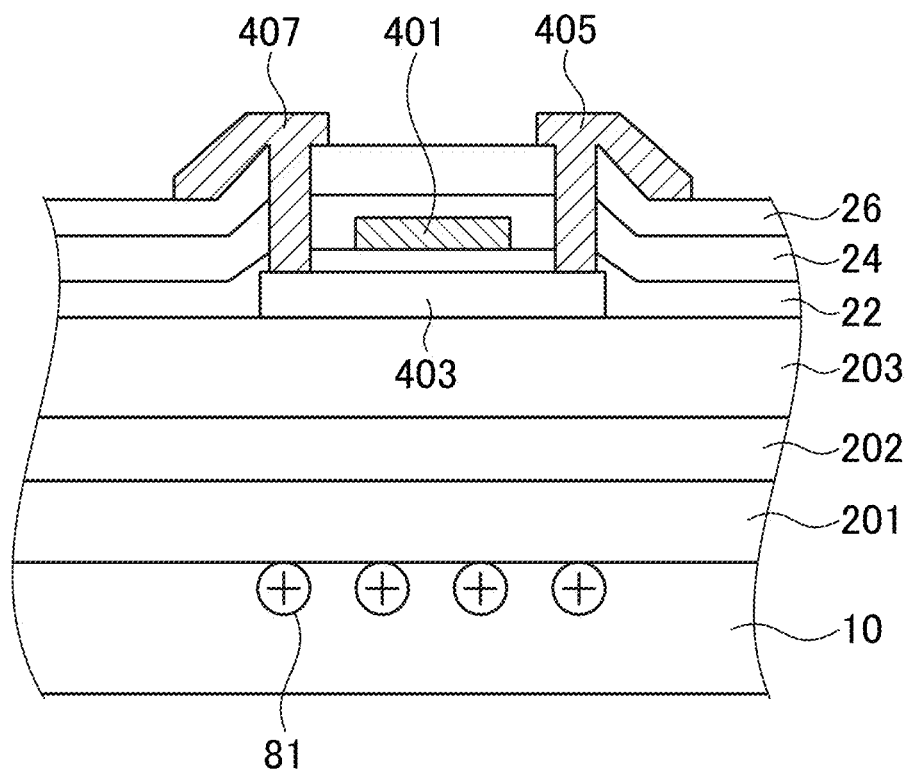
FIG. 3 is a cross-sectional view illustrating a comparative example of the organic EL display device.

FIG. 3 is a cross-sectional view illustrating a comparative example of the organic EL display device. In the example of FIG. 2, description of layers above the source electrode 405 and the drain electrode 407 has been omitted. In the example of FIG. 3, the electric field inhibition film 205 is not provided. In this case, an electric field generated by the charges 81 stored in the substrate 10 affects the semiconductor film 403 without being inhibited compared to the embodiment. Thus, the variation in the characteristics of the thin film transistor arises more easily.

Figure 4:
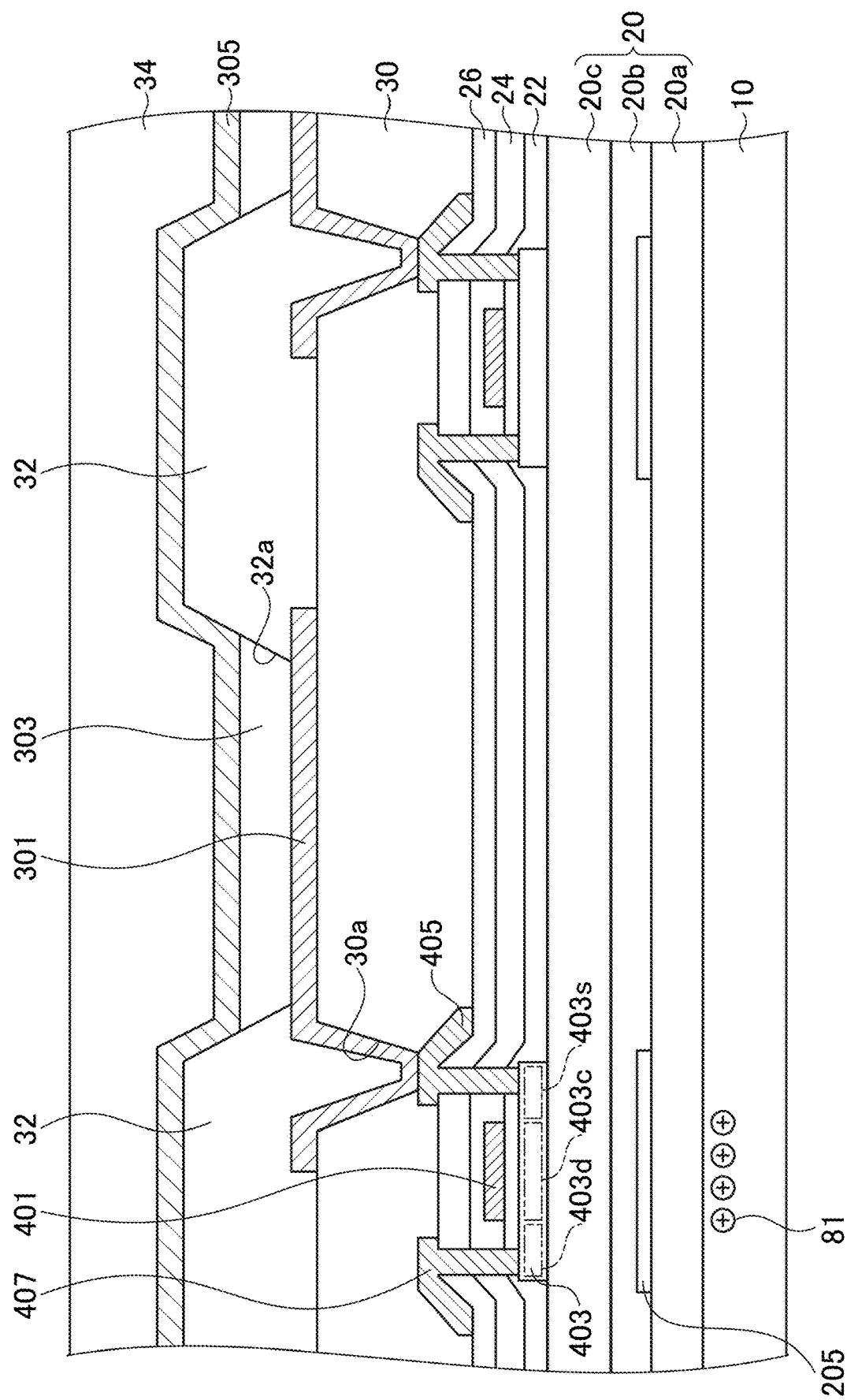
FIG. 4 is a diagram illustrating a modification example of the cross-sectional view of FIG. 2.

Here, the electric field inhibition film 205 may cover at least the channel region 403c. As illustrated in FIG. 4, the electric field inhibition film 205 may be disposed more outside than the edge of the semiconductor film 403 on the side of the source region 403s and the edge of the semiconductor film 403 on the side of the drain region 403d when viewed in the extension direction of the channel region 403c. Here, since the alumina used for the electric field inhibition film 205 is a hard material, it is desirable to decrease the size of the electric field inhibition film in order to avoid occurrence of a crack or the like. The electric field inhibition film 205 is desirably disposed more inside than the edge of the semiconductor film 403 on the side of the source region 403s and the edge of the semiconductor film 403 on the side of the drain region 403d when viewed in the extension direction of the channel region 403c.

When the semiconductor film 403 is formed of polysilicon, electron mobility is large. Therefore, it is easier to have an influence of the charges 81 inside the substrate 10. Therefore, when the semiconductor film 403 is formed of polysilicon, it is more appropriate to use the electric field inhibition film 205. However, even when the semiconductor film 403 is formed of semiconductor oxide, an effect can be obtained.

A flattened layer 30 is provided to cover the source electrode 405 and the drain electrode 407. As the flattened layer 30, an organic material such as photosensitive acrylic is used since the organic material has more excellent flatness of a surface than that of an inorganic insulating material formed by a chemical vapor deposition (CVD) or the like.

The flattened layer 30 includes an opening 30a that exposes the source electrode 405. The pixel electrode 301 conducted to the source electrode 405 through the opening 30a is provided. The pixel electrode 301 may have, for example, a 3-layer stacked structure of an indium zinc oxide (IZO) film, an Ag film, and an IZO film. The pixel electrode 301 spreads from the upper end of the opening 30a to a lateral side of the opening 30a. Instead of the source electrode 405, the drain electrode 407 may be connected to the pixel electrode 301.

A bank 32 is formed above the flattened layer 30, for example, above the opening 30a. The bank 32 is formed of photosensitive acrylic that has an insulation property as in the flattened layer 30. The bank 32 is provided between the unit pixels 44 adjacent to each other and has an opening 32a corresponding to a light-emitting region which the unit pixel 44 has. The lateral surface of the opening 32a has a tapered shape and the pixel electrode 301 is exposed on the bottom of the opening 32a. An organic EL layer 303 is provided above the pixel electrode 301 and in the opening 32a. The organic EL layer 303 includes a hole injection layer, a hole transport layer, a light-emitting layer, an electron transport layer, and an electron injection layer. These layers may be formed by deposition or may be formed by coating. In the drawing, these layers are formed in the opening 32a, but at least some of these layers may be formed above the bank 32. Some of these layers may be formed across the plurality of unit pixels 44.

A counter electrode 305 is provided above the organic EL layer 303. The counter electrode 305 may be formed of, for example, an alloy of Mg and Ag formed as a thin film to the extent that light emitted from the organic EL layer 303 is transmitted or may be formed of ITO. The counter electrode 305 is also provided above the bank 32. In the organic EL layer 303, light is emitted by a current flowing between the pixel electrode 301 and the counter electrode 305.

A sealing layer 34 is provided above the counter electrode 305. The sealing layer 34 prevents moisture from the outside from intruding into the organic EL layer 303. The sealing layer 34 has, for example, a stacked structure of a silicon nitride film, an organic resin layer, and a silicon nitride film.

A cover glass or touch panel substrate or the like may be provided above the sealing layer 34. In this case, a space between the sealing layer 34 and the cover glass or touch panel substrate may be filled with a filling material such as a resin. A counter substrate formed of a material such as polyimide that has flexibility may be disposed above the sealing layer 34.

Here, to facilitate bending, partial regions of the underlying layer 20 and layers from the first insulating layer 22 to the third insulating layer 26 may be removed. In this case, the underlying layer 20 includes a plurality of underlying films separated from each other, but each underlying film may include the plurality of electric field inhibition films 205. When a portion which is bent (a bending portion) is determined in a display device in which a display region is bent, a structure in which the electric field inhibition film 205 is not disposed in the bending portion may be included. Since the alumina used in the electric field inhibition film 205 is a hard material, the electric field inhibition film is not disposed in the bending portion and is disposed in a non-bending portion, and thus it is possible to obtain the effect of inhibiting a variation in the characteristics of the thin film transistor due to the charges 81 stored in the substrate 10 while maintaining the flexibility.

In the example of FIG. 2, the example in which the present invention is applied to the thin film transistor used in the unit pixel 44 in the display region 42 has been described, but the present invention may be applied to a thin film transistor included in the driving circuit above the peripheral region 46. Since it is necessary for the thin film transistor formed in the peripheral region 46 above the substrate 10 to flow more currents, a thin film transistor formed of polysilicon is generally disposed. Since an oxide semiconductor is less used unlike the unit pixel 44, it is possible to obtain the effect of inhibiting the variation in the characteristics of the thin film transistor more reliably by using the electric field inhibition film 205. In a part of the thin film transistor formed in the peripheral region 46, one of the source electrode 405 and the drain electrode 407 is connected to a scanning line extending in the display region 42. The scanning line is electrically connected to the gate electrode 401 of the thin film transistor included in the unit pixel 44. Of course, the electric field inhibition film 205 may be provided only in the thin film transistor in the display region 42 or may be provided only in the thin film transistor included in the driving circuit. The electric field inhibition film 205 may be used in both the thin film transistors in the display region 42 and the thin film transistor included in the driving circuit.

Figure 5:
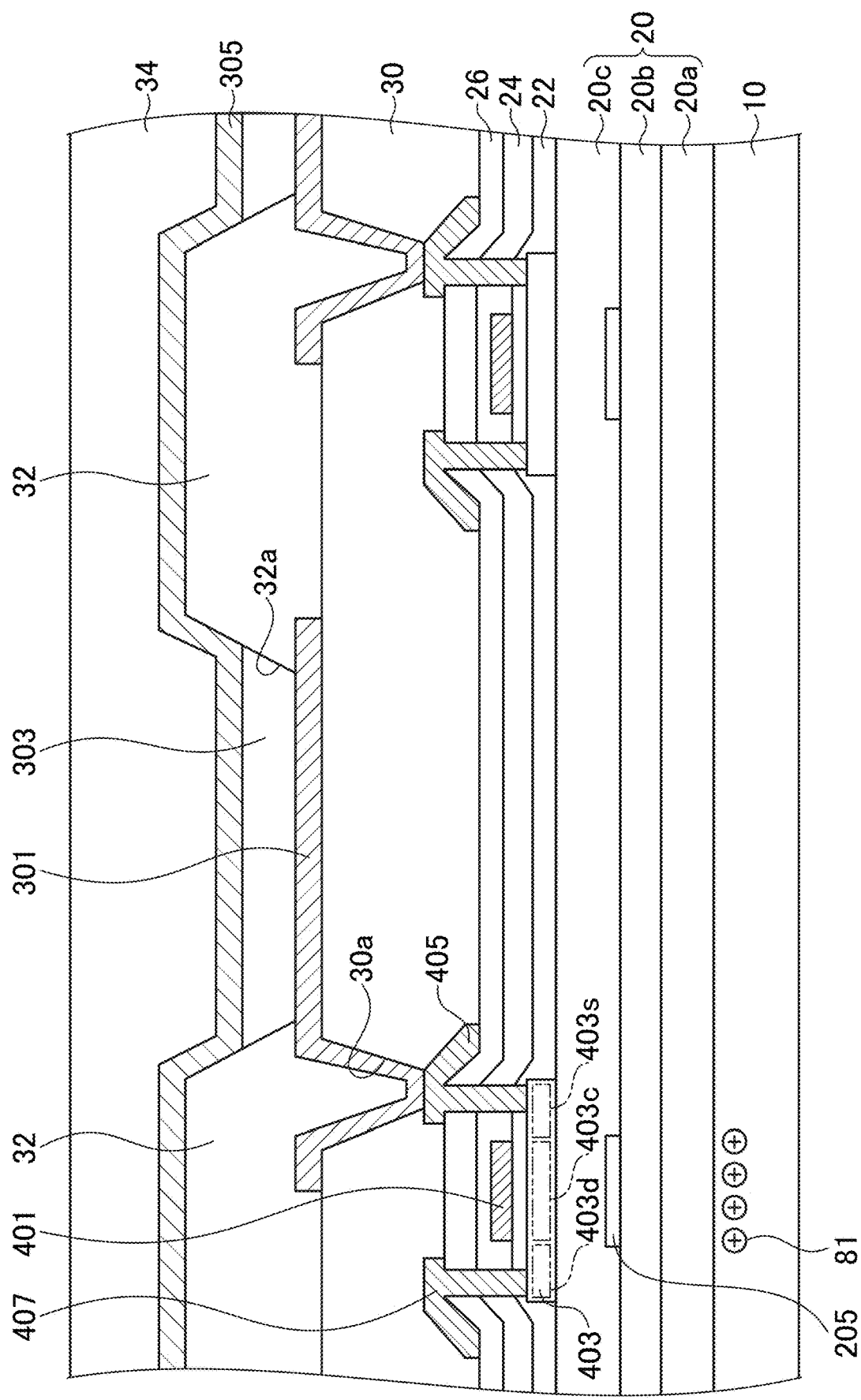
FIG. 5 is a diagram illustrating another modification example of the cross-sectional view of FIG. 2.

FIG. 5 is a diagram illustrating a modification example of the cross-sectional view of FIG. 2. In FIG. 5, the electric field inhibition film 205 is located between the second underlying layer 20b and the third underlying layer 20c. The electric field inhibition film 205 illustrated in FIG. 5 is disposed more inside than the edge of the semiconductor film 403 on the side of the source region 403s and the edge of the semiconductor film 403 on the side of the drain region 403d when viewed in the extension direction of the channel region 403c as in FIG. 2. However, the electric field inhibition film 205 may be disposed more outside than the edge of the semiconductor film 403 on the side of the source region 403s and the edge of the semiconductor film 403 on the side of the drain region 403d when viewed in the extension direction of the channel region 403c as in FIG. 4. Even in the configuration illustrated in FIG. 5, it is possible to inhibit the variation in the characteristics of the thin film transistor due to the charges 81 stored in the substrate 10.

The present invention is not limited to the above-described embodiments and various modifications can be made. For example, the configurations described in the embodiments can be substituted with substantially the same configurations, configurations for obtaining the same operational effects, or configurations for achieving the same goals. The examples in which the present invention is applied to the organic EL display device have been described. However, the present invention can also be applied to another type of display device such as a liquid crystal display device that includes a substrate formed of an organic material.

What is claimed is:

1. A display device comprising:
   a substrate configured to contain an organic material;
   a first underlying film provided above the substrate;
   a thin film transistor provided above the first underlying film;
   a semiconductor film included in the thin film transistor and configured to have a channel region; and
   an electric field inhibition film provided between the first underlying film and the semiconductor film and configured to overlap the channel region in a plan view, wherein
   the electric field inhibition film has a higher permittivity than the first underlying film,
   a display region including a plurality of pixels and a peripheral region located outside of the display region are included above the substrate,
   a driving circuit that drives the plurality of pixels is located in the peripheral region,
   the thin film transistor is included in the driving circuit, and
   the electric field inhibition film is located in the peripheral region.

2. The display device according to claim 1, wherein
   a second underlying film is located between the first underlying film and the semiconductor film,
   the electric field inhibition film is located between the first underlying film and the second underlying film,
   the first underlying film contains silicon oxide,
   the second underlying film contains silicon nitride, and
   the first underlying film comes into direct contact with the second underlying film.

3. The display device according to claim 1, wherein
   a second underlying film is located above the first underlying film,
   a third underlying film is located above the second underlying film,
   the semiconductor film is located above the third underlying film to come into direct contact with the third underlying film, and
   the electric field inhibition film is located between the second and third underlying films.

4. The display device according to claim 3, wherein
   the second underlying film contains silicon nitride, and
   the third underlying film contains silicon oxide.

5. The display device according to claim 1, wherein
   the electric field inhibition film is an alumina film.

* * * * *